(12) United States Patent
Yang

(10) Patent No.: US 9,299,622 B2
(45) Date of Patent: Mar. 29, 2016

(54) ON-CHIP PLASMA CHARGING SENSOR

(71) Applicant: Semiconductor Manufacturing International (Shanghai) Corporation, Shanghai (CN)

(72) Inventor: Jiuun-Jer Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/323,749

(22) Filed: Jul. 3, 2014

(65) Prior Publication Data

US 2015/0079706 A1   Mar. 19, 2015

Related U.S. Application Data

(62) Division of application No. 13/035,895, filed on Feb. 25, 2011, now Pat. No. 8,796,685.

(30) Foreign Application Priority Data

Mar. 5, 2010   (CN) .......................... 2010 1 0118827

(51) Int. Cl.
  *H01L 21/28*   (2006.01)
  *H01L 21/66*   (2006.01)
  *H01L 29/788*   (2006.01)
  (Continued)

(52) U.S. Cl.
  CPC ............ *H01L 22/14* (2013.01); *H01L 21/0271* (2013.01); *H01L 21/266* (2013.01); *H01L 21/28273* (2013.01); *H01L 22/32* (2013.01); *H01L 29/66825* (2013.01);
  (Continued)

(58) Field of Classification Search
  IPC ........................................ H01L 22/32,27/11517
  See application file for complete search history.

(56) References Cited

U.S. PATENT DOCUMENTS

| 5,410,161 A | 4/1995 | Narita |
| 5,959,309 A | 9/1999 | Tsui et al. |

(Continued)

FOREIGN PATENT DOCUMENTS

CN   101577266 B   1/2012

OTHER PUBLICATIONS

Restriction Requirement for U.S. Appl. No. 13/035,895 mailed Aug. 8, 2012, 4 pages.

(Continued)

*Primary Examiner* — Eugene Lee
(74) *Attorney, Agent, or Firm* — Kilpatrick Townsend & Stockton LLP

(57) ABSTRACT

A device for monitoring charging effects includes a semiconductor substrate having a surface region. The device also includes first, second, and third doped regions spaced apart in the semiconductor substrate and a dielectric layer overlying the surface region. The device also includes a first gate overlying a first portion of the dielectric layer disposed between the first and the second doped regions, and a second gate overlying a second portion of the dielectric layer disposed between the second and the third doped regions, the second gate being characterized by a first surface area. Moreover, the device has a conductive layer electrically coupled to the second gate for collecting plasma charges. The conductive layer is characterized by a second surface area. The first gate is connected to a conductor that is coupled to a bias voltage, and the second gate is a floating gate that is not connected to any voltage.

12 Claims, 6 Drawing Sheets

(51) Int. Cl.
    *H01L 21/027* (2006.01)
    *H01L 21/266* (2006.01)
    *H01L 29/66* (2006.01)
    *H01L 27/115* (2006.01)

(52) U.S. Cl.
    CPC ........ *H01L 29/788* (2013.01); *H01L 27/11517* (2013.01); *H01L 2924/0002* (2013.01)

(56) References Cited

U.S. PATENT DOCUMENTS

| | | | |
|---|---|---|---|
| 6,096,609 | A | 8/2000 | Kim et al. |
| 6,191,441 | B1 | 2/2001 | Aoki et al. |
| 6,372,525 | B1 | 4/2002 | Lin et al. |
| 6,373,109 | B1 | 4/2002 | Ahn |
| 6,417,544 | B1 | 7/2002 | Jun et al. |
| 6,448,599 | B1 | 9/2002 | Wang |
| 6,465,768 | B1 | 10/2002 | Ker et al. |
| 6,465,848 | B2 | 10/2002 | Ker et al. |
| 6,552,399 | B2 | 4/2003 | Jun et al. |
| 6,563,175 | B2 | 5/2003 | Shiau et al. |
| 6,664,140 | B2 | 12/2003 | Lee et al. |
| 6,683,351 | B2 | 1/2004 | Morita et al. |
| 7,116,606 | B2 | 10/2006 | Chou et al. |
| 7,535,063 | B2 | 5/2009 | Kao |
| 8,039,873 | B2 | 10/2011 | Abe et al. |
| 8,796,685 | B2 | 8/2014 | Yang |
| 2003/0006412 | A1* | 1/2003 | Martin et al. .................. 257/48 |
| 2005/0242439 | A1 | 11/2005 | DeVries et al. |
| 2008/0238550 | A1 | 10/2008 | Sasaki et al. |
| 2009/0243725 | A1 | 10/2009 | Abe et al. |
| 2010/0314685 | A1 | 12/2010 | Zhou et al. |

OTHER PUBLICATIONS

Non-Final Office Action for U.S. Appl. No. 13/035,895 mailed Sep. 28, 2012, 4 pages.
Final Office Action for U.S. Appl. No. 13/035,895 mailed Feb. 21, 2013, 5 pages.
Non-Final Office Action for U.S. Appl. No. 13/035,895 mailed Jul. 12, 2013, 5 pages.
Final Office Action for U.S. Appl. No. 13/035,895 mailed Nov. 25, 2013, 7 pages.
Notice of Allowance for U.S. Appl. No. 13/035,895 mailed Mar. 21, 2014, 7 pages.

* cited by examiner

ON-CHIP PLASMA CHARGING SENSOR

CROSS-REFERENCES TO RELATED APPLICATIONS

This application is a divisional patent application of U.S. patent application Ser. No. 13/035,895, filed Feb. 25, 2011, which claims priority to Chinese Patent No. 201010118827.4, filed Mar. 5, 2010, which is commonly owned and incorporated by reference herein for all purposes.

BACKGROUND OF THE INVENTION

Embodiments of the present invention generally relate to integrated circuits and the processing for the manufacture of semiconductor devices. More particularly, embodiments of the invention provide a method and device for monitoring charging effects in the manufacture of integrated circuits. Merely by way of example, the invention has been applied to reducing and monitoring electrical charges on processed and/or partially processed integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, among others, wafer growth, photolithography, doping, oxidation, deposition, etching removal, and epitaxial growth.

Semiconductor devices and circuits are formed in wafers, which serve as substrates. Generally, single-crystal substrates, which are made from a single material with crystals formed by atoms all aligned in a specific direction. The process of waver creation usually involves creating a large ingot of semiconductor materials, aligning the ingot, removing impurities, slicing ingot into thin wafers, and polishing the sliced wafers.

Generally, photolithography processes are used to define and shape specific areas of the wafer to suit particular design of an integrated circuit. Usually, a layout design is used to create an optical mask (or reticle). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various processes are finished, photoresist materials are then removed.

One of the various processes is oxidation, which creates insulating layers. Often, oxide grows on silicon in a wafer to form dielectrics made of $SiO_2$. One of the method to grow oxide on wafer is exposing wafer to $O_2$ at high temperatures.

Deposition is another process in the semiconductor fabrication. Deposition provides connections among insulators and interconnecting layers by depositing various materials. Techniques such as chemical vapor deposition (CVD) and lower pressure CVD (LPCVD) are commonly used. For example, metals are deposited to provide low resistance interconnects, polysilicon is used as conductor, and dielectric materials and/or field oxide are deposited to create insulating layers.

Another processes is doping, which changes the electrical properties of the wafer. For example, a specific area of the wafer may be doped and become n-type or p-type depending upon the doping material used and its concentration. There are several ways to perform doping. One way is implantation, in which atoms are injected into wafers at high velocity. Another way of doping is through diffusion, in which atoms are diffused into selected region of the wafer at high temperature.

Etching is another important process in the semiconductor fabrication. Etching involves removing selected regions from the surface of a wafer using physical process, chemical process, or the combination thereof. Usually the objective of etching is to faithfully reproduce masking patterns. To achieve this objective, it is often desirable for the etching process to be highly selective both in patterns and depth, which is often achieved through chemical dry etching.

Chemical dry etching usually involves generating reactive species in a plasma, diffusing these species to the surface of material being etched, species being absorbed, reacting these species on the surface to form volatile by-products, desorbing the by-products from the surface, and diffusing the desorbed species into gas. There are many various dry-etch systems to accomplish these steps. For example, dry-etch systems include barrel etchers, downstream etchers, parallel-electrode (planar) reactor etchers, stacked parallel-electrode etchers, hexode batch etchers, magnetron ion etchers, etc.

Typically, an integrated circuit fabrication goes through the abovementioned processes multiple times. During these processes, electrical charges build up on the wafer surface. For example, processes such as plasma etching, ashing, ion implantation all can cause electrical charge build up. Often, electrical charge build up leads to wafer unreliability and other problems.

As transistor sizes continue to decrease, the gate oxide becomes increasingly more susceptible to process induced damage. When plasma is used in various fabrication steps, localized build up creates significant electric fields that produce tunneling current. Defects initiated by this tunneling current cause decreased breakdown voltages, increased leakage current, and deteriorated oxide reliability.

Plasma is needed in MOSFET processing for many fabrication steps such as sputtering, etching, photoresist ashing, and dielectric deposition. Exposure to plasma may result in damage from unwanted oxide charging.

One of the conventional techniques for monitoring electrical charges is to use special test wafers. FIG. 1 is a simplified diagram illustrating a conventional test structure for monitoring wafer charges. As shown in FIG. 1, a test structure 100 includes an EEPROM cell 102 and an antenna 101. The antenna 101 is connected to the EEPROM cell 102 and collects charges thereof.

The test structure 100 of the prior art can be an effective tool for certain applications. However, the test structure 100 is a specific test structure that requires an expensive fabrication process and that may not be used for every integrated circuit that is manufactured. As a result, the application of the test structure 100 is often limited to equipment diagnosis and calibration.

Another prior art technique for monitoring and partially removing electrical charges uses an area-intensive conductor relatively to terminals of metal-oxide semiconductors. FIG. 2 is a simplified diagram illustrating a conventional test structure for measuring electrical charges on semiconductors. As shown in FIG. 2, the test structure 200 includes an antenna 201 that is connected to a gate 203 of a MOSFET 202. For example, the antenna 201 has a large area that is connected to the floating gate 203. The antenna 201 collects electrical charges (i.e., leakage at the gate oxide) from the gate 203. By measuring the electrical charges, the charging effects due to various processes can be evaluated. Typically, the test structure 200 can be implemented as full flow electrical structures manufactured together with real products, under the assumption that the test structure 200 will likely mirror the electrical charges on real products.

Therefore, an improved system and method for reducing and monitoring electrical charging on wafers is desired.

BRIEF SUMMARY OF THE INVENTION

Embodiments of the present invention relate to integrated circuits and the processing for the manufacture of semiconductor devices. More particularly, embodiments of the invention provide a method and device for monitoring the charging effects in the manufacture of integrated circuits. Merely by way of example, a method for monitoring charging effect includes attaching a charge-collecting antenna structure to a floating gate in an MOS device. In some embodiments, the floating gate can be formed in the same step as the MOS or CMOS gate structures in a conventional CMOS process. In this case, the method does not require a more expensive EEPROM or flash process. For example, a double poly process or a tunnel oxide process is not needed. Additionally, embodiments of the present invention also provide simple testing methods. In an example, DC testing methods, including leakage current characteristics measurements, can be used for determining charging effects. The methods do not require expensive testing equipment and procedures usually associated with non-volatile memory testing methods. Accordingly, embodiments of the present invention provide a cost-effective method that is compatible with conventional process technology and testing methodology without substantial modifications to conventional equipment and processes.

Embodiments of the invention have been applied to monitoring electrical charges on processed and/or partially processed integrated circuits. But it would be recognized that the invention has a much broader range of applicability.

An embodiment of the present invention provides a device for monitoring charging effects. The device includes a semiconductor substrate having a surface region. The device also includes first, second, and third doped regions spaced apart in the semiconductor substrate adjacent to the surface region. A dielectric layer is disposed overlying the surface region. The device also includes a first gate structure overlying a first portion of the dielectric layer between the first and the second doped regions, and a second gate structure overlying a second portion of the dielectric layer between the second and the third doped regions, the second gate being characterized by a first surface area. Moreover, the device has a conductive layer electrically coupled to the second gate for collecting charges. The conductive layer is characterized by a second surface area. In the device, the first gate region is connected to a conductor that is coupled to a bias voltage, and the second gate region is not connecting to any conductor which is coupled to an operating voltage.

In an embodiment of the device described above, the second gate is a floating gate.

In another embodiment of the device, the conductive layer comprises an antenna structure that is characterized by a charge collection efficiency. And the charge collection efficiency is related to an antenna ratio which is defined as a ratio between the second surface area and the first surface area.

In another embodiment, the first portion of the dielectric layer and the second portion of the dielectric layer have substantially a same thickness. In a specific embodiment, the first portion of the dielectric layer and the second portion of the dielectric layer are formed in the same dielectric forming process.

In another embodiment, the first gate region and the second gate region have substantially the same thickness. In a specific embodiment, the first gate region and the second gate region are formed in the same gate forming process.

In another embodiment, the substrate is characterized by a p-type conductivity and the source is characterized by a n-type conductivity.

In yet another embodiment, the floating gate is connected to the conductive layer through a via chain.

Some embodiments of the invention provide a method of making a device for monitoring charging effects. The method includes providing a semiconductor substrate having a surface region, forming a dielectric layer overlying the surface region; implanting first impurities into the semiconductor substrate, and implanting second impurities into a selected region of the semiconductor substrate. The method also includes forming a gate dielectric layer overlying the semiconductor substrate, forming a polysilicon material overlying the gate dielectric, and patterning the polysilicon material to form a first gate and a second gate. The method also includes forming first, second, and third doped regions spaced apart in the semiconductor substrate. The first gate overlies a first portion of the dielectric layer and is disposed between the first and the second doped regions, and the second gate region overlies a second portion of the dielectric layer and is disposed between the second and the third doped regions. The method also includes forming a conductive layer electrically coupled to the second gate for collecting charge.

In a specific embodiment, the above method also includes forming a second dielectric layer overlying the second gate region, before forming the conductive layer overlying the second dielectric layer.

In another embodiment, the method also includes forming a via structure through the second dielectric layer, the via structure is configured to electrically connect the conductive layer to the second gate.

In another embodiment, the method also includes forming a connection between the first gate and a first bias voltage.

In another embodiment, the method also includes maintaining the second gate free from connecting to any operating voltage so that the second gate is a floating gate.

An alternative embodiment of the present invention provides a method for determining electrical charges on a processed semiconductor device. The method includes providing a substrate material having a first doped region, a second doped region, and a third doped region. The method also includes forming a gate dielectric layer over the substrate including the first, second, and third doped regions. The method further includes forming a first gate and a second gate overlying the substrate material. The first gate and the second gate are separated by the second doped region. In addition, the method includes providing a charge collecting component that is configured to collect electrical charges in a plasma environment and is electrically coupled to the second gate. In an embodiment, if the first doped region is a source of the first gate, the third doped region is then a drain of the first gate. The second gate is a floating gate as it is not connected to any operating voltage. The method also includes determining an electrical property associated with a current between the source and the drain. The current is related with a charge accumulated at the floating gate. The method further includes determining a level of electrical charge based at least in part the electrical property.

In an embodiment, the above method also includes determining a leakage current characteristic, the leakage current characteristic being associated with an accumulated charge on the floating gate.

In another embodiment of the method, the floating gate is connected to the charge collection component through a via chain.

In another embodiment of the method, the substrate is characterized by a p-type conductivity and the source is characterized by a n-type conductivity.

In another embodiment of the method, the source is electrically coupled to a protection diode.

Many benefits are achieved by way of embodiments of the present invention over conventional techniques. For example, embodiments of the invention provide a process that is compatible with conventional process technology and testing methodology without substantial modifications to conventional equipment and processes. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for monitoring charging effects for the manufacture of integrated circuits. Merely by way of example, the invention has been applied to reducing and monitoring electrical charges on processed and/or partially processed integrated circuits. But it would be recognized that the invention has a much broader range of applicability.

As explained above, plasma is needed in MOSFET processing for many fabrication steps such as sputtering, etching, photoresist ashing, and dielectric deposition. Exposure to plasma may result in damage from unwanted oxide charging.

The degree of gate oxide degradation is directly related to the field induced Fowler-Nordheim (F-N) tunneling current, which is determined by the gate sizes and the size of conducting surfaces connected to the gate. Metals connected to the gate act as antenna structures that collect charges during plasma processing of integrated circuits. The quantity of charges is referred to as the antenna ratio. The antenna ratio is defined as the ratio of the area of the conducting material over the thick oxide (that is overlying the gate) to the area of the gate. As the antenna ratio increases, the extent of the damage done to the gate oxide will increase accordingly.

Figure 1:
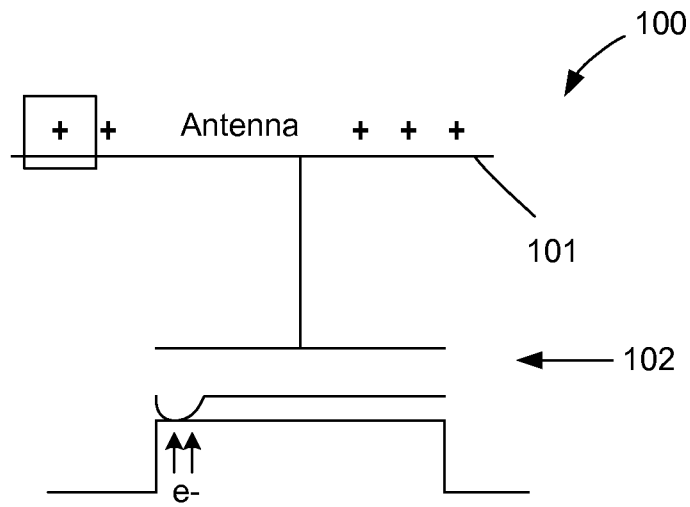
FIG. 1 is a simplified diagram illustrating a conventional test structure for monitoring wafer charges.
Figure 2:
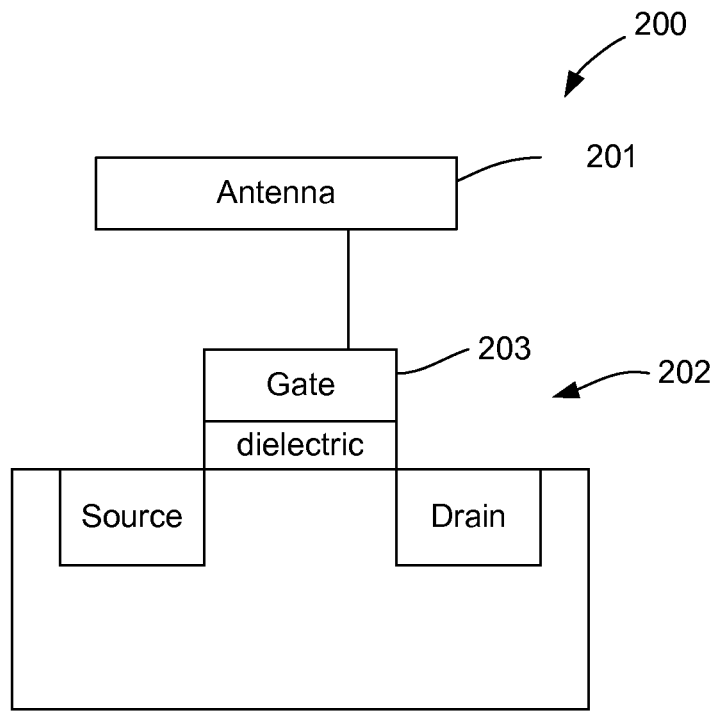
FIG. 2 is a simplified diagram illustrating a conventional test structure for measuring electrical charges on semiconductor.

As described above, conventional test structures as illustrated in FIGS. 1 and 2 are specialized test structures and require special fabrication and/or testing processes, and, therefore, cannot be used on every processed integrated circuits. In addition, solely serving as monitoring devices, these test structures often take up valuable space on semiconductor wafers.

Figure 3:
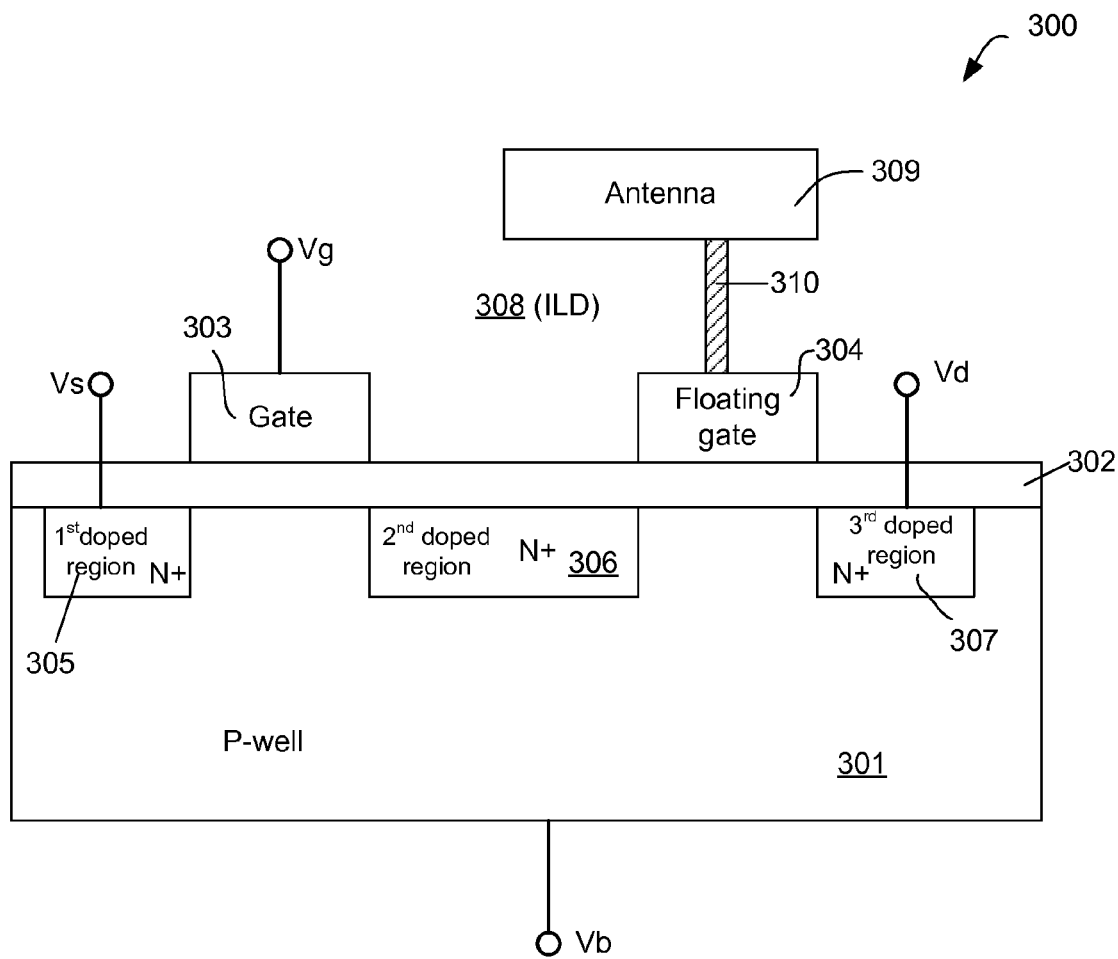
FIG. 3 is a simplified diagram illustrating a device for charge monitoring according to an embodiment of the present invention.

FIG. 3 is a simplified diagram illustrating a semiconductor device according to an embodiment of the present invention. This diagram is merely an example, which should not unduly limit the scope of the claims. One of ordinary skill in the art would recognize many variations, alternatives, and modifications. For example, in an embodiment, the device can be used as an inline electrical charge sensor.

As shown in FIG. 3, an inline electrical charge sensor system is implemented with a metal-oxide semiconductor field effect transistor (MOSFET) 300. It is to be understood that the system can be implemented with other types of integrated circuits. The MOSFET 300 includes the following components:

1. a substrate 301;
2. a dielectric layer 302 overlying the substrate;
3. a gate 303;
4. a floating gate 304;
5. a first doped region 305, a second doped region 306, a third doped region 307;
6. an interlayer dielectric layer 308; and
7. a conductor plate 309, i.e., an antenna for collecting electric charge in an plasma environment.

As shown in FIG. 3, the MOSFET 300 is an n-channel MOSFET. It is to be understood that some embodiments of the present invention are implemented with p-channel MOSFETs and other types of semiconductor devices as well. The MOSFET 300 includes two gates. The gate 303 is used for normal operations of the MOSFET 300. According to an embodiment, the floating gate 304 is able to store electric charges for extended period of time. As an example, the floating gate 304 can include a capacitor. The floating gate 304 is electrically coupled to the conductive plate 309 through a via 310. Depending on the embodiment, the conductive plate can have a relatively large area that can be used for collecting electric charges and serves as an antenna. The collected charges can change the potential of the floating gate. The sensitivity of the antenna can be characterized by an antenna ratio, which can be defined by an ratio of the antenna surface area and the floating gate surface area, which is in contact with the interlayer dielectric layer 308.

In an embodiment, the first gate is disposed between the first and second doped regions, where the first doped region forms a source for the first gate. The floating gate is disposed between the second and third doped regions, where the third doped region form a drain for the first gate. The second doped region is interposed between the first and third doped regions and separates the gate 303 and the floating gate 304.

The conductive plate collects charges and provides the charges to floating gate 304 through via 310. The amount of electric charges in the floating gate provides a degree of damage caused by the plasma charging effects on the dielectric layer of the MOSFET device.

According to an embodiment, a current flow in MOSFET 300 can be determined in substantially the same manner as a conventional MOSFET. For example, appropriate bias voltages are applied to the source 305, the gate 303, the drain 307, and the substrate 301, a leakage current and/or a threshold voltage of MOSFET device 300 can be determined. As a result of the applied bias voltages, the second doped region 306 has a voltage potential due to capacitive coupling. For example, the floating gate potential and oxide charges also affect the drain current. It is noted that the floating gate is so called because it is not connected to any voltage potential.

According to a specific embodiment, the current flow in MOSFET 300 is affected by the amount of charges on antenna 309 and floating gate 304. Accordingly, a method for monitoring charging effects is provided using a device similar to MOSFET 300.

Embodiments of the present invention provide a method for determining electric charges on a semiconductor. The method includes submitting a device having a structure shown in FIG. 3 in a plasma environment. The floating gate is loaded with electric charges collected by the conductive plate (i.e., the antenna). The method includes applying appropriate bias voltages to first doped region 305, third doped region 307, gate 303 and substrate 301. No bias voltage is applied to second doped region 306 and floating gate 304. The method includes determining a leakage current and/or the threshold voltage of the floating gate, wherein the determined amount of leakage current and/or the threshold voltage indicates a degree of damage caused by the plasma. In an embodiment, the bias voltage at the gate is equal to or greater than the bias voltage at the first doped region and the threshold voltage at the second doped region.

Figure 4:
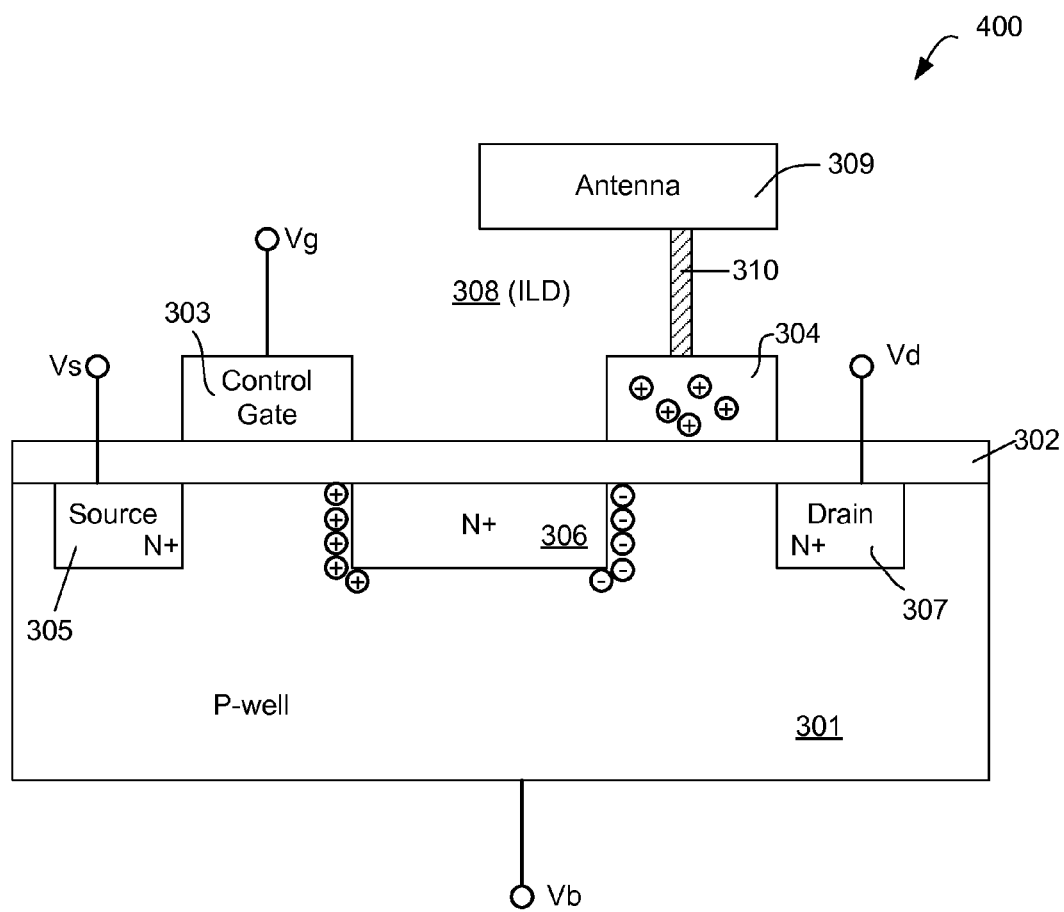
FIG. 4 is a simplified diagram illustrating an improved electric field of a device for charge monitoring according to an embodiment of the present invention.

FIG. 4 is a simplified diagram illustrating a device 400 for charge monitoring according to an embodiment of the present invention. In an embodiment, the substrate is characterized by a p-type conductivity, the first, second, and third doped regions are characterized by an n-type conductivity. The electric charges in the plasma environment have more positive charges than negative charges, so that the antenna and floating gate are charged positively. The bias voltage at the gate is greater than the threshold voltage of the MOSFET device. Positive charges are accumulated at the side of the second doped region 306 at the proximity of the gate 303 and negative charges are accumulated at the side of the second doped region 306 at the proximity of the floating gate 304. The electric field strength between the second doped region and the floating gate is thus increased and improves the sensitivity of the measurement of the leakage current and the threshold voltage.

Figure 5:
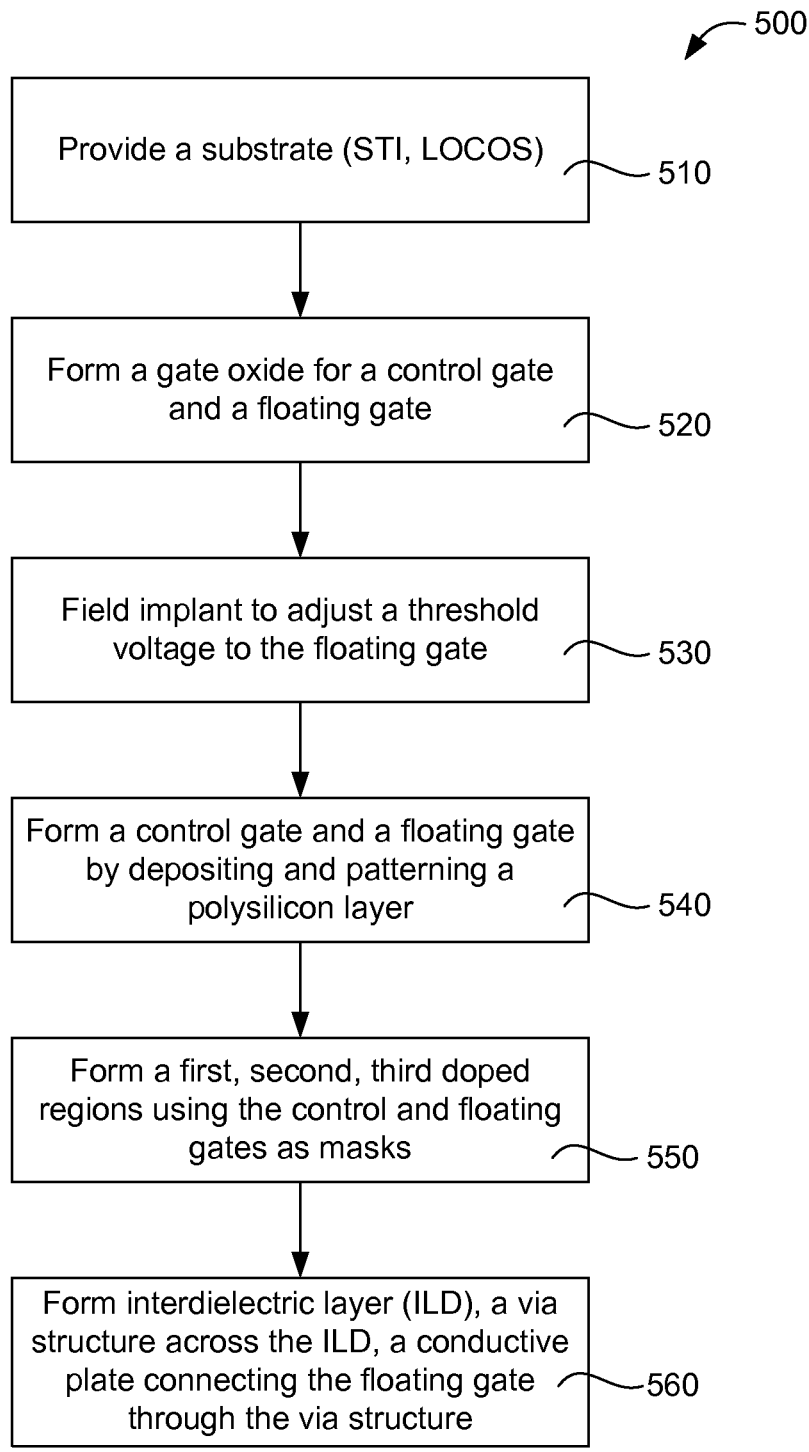
FIG. 5 is a simplified flowchart diagram of a method for making a device for monitoring charging effects according to an embodiment of the present invention.

FIG. 5 is a flow chart illustrating a method 500 of making a device for monitoring charging effects according to an embodiment of the present invention. This diagram is merely an example, which should not unduly limit the scope of the claims. One of ordinary skill in the art would recognize many variations, alternatives, and modifications. Method 500 includes providing a substrate and forming a field oxide layer using a LOCOS process at step 510. After LOCOS, the method forms a gate oxide process for a gate region and a floating gate process for a floating gate region at step 520. In an embodiment, the gate oxide process and the floating gate process are formed in a same oxide process, and the thickness of the gate oxide is significantly the same as the thickness of the floating gate oxide. At step 530, a field implant is performed in the floating gate region to adjust the threshold voltage of the floating gate region while the gate oxide is masked. The mask of the gate region is removed and a polysilicon layer is deposited and patterned to form a gate structure and a floating gate structure at step 540. The method forms first, second, and third doped regions using the gate and the floating gate structures as protective masks at step 550. The method also forms an interlayer dielectric layer (ILD) over the floating gate structure, a via across the interlayer dielectric layer and a conductive plate over the via at step 560.

Figure 6A:
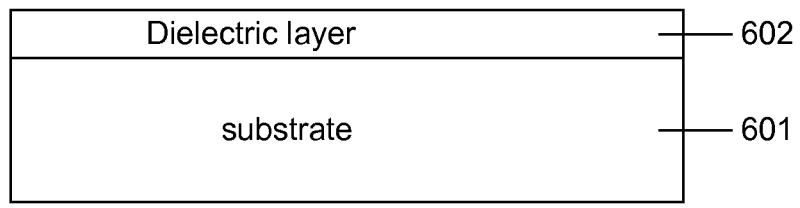
FIGS. 6A-B, through 9 are simplified cross-sectional diagrams illustrating a method of making a device for determining electrical charges according to an embodiment of the present invention.
Figure 6B:
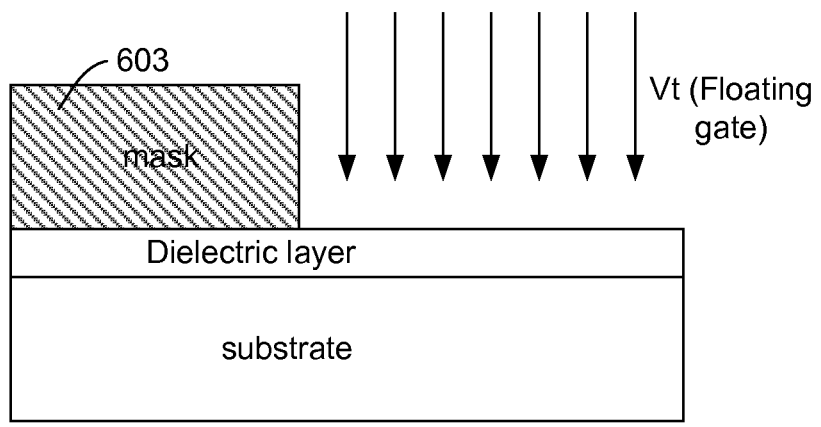
Figure 7:
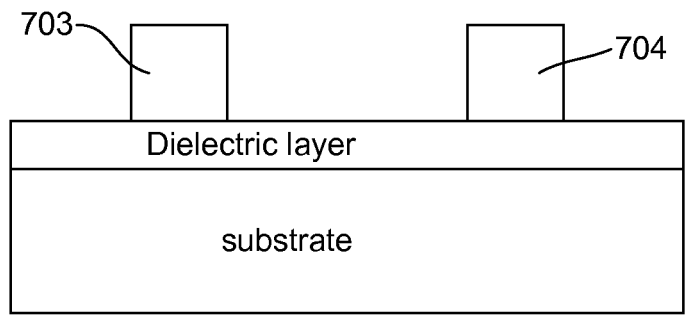

FIG. 6A is a cross-sectional diagram illustrating a substrate 601 having a gate dielectric layer 602. The substrate may be a p-type silicon substrate in an embodiment of the present invention. The gate dielectric layer can be in situ stream generated or by rapid thermal oxidation (RTO). The gate dielectric layer has a thickness of about 0.1 mm to about 3.0 mm in a preferred embodiment. A layer of photoresist is then deposited and patterned to form a mask 603 covering a control gate region while exposing a floating gate region. The floating gate region is then implanted with a threshold voltage adjustment (Vt) implant followed by a field implant as shown in FIG. 6B. Both implants use a p-type impurity such as boron or boron difluoride ($BF_2$) to adjust the threshold voltage of the floating gate turn-on voltage. The mask is then removed and a polysilicon layer is depositing over the gate dielectric layer and patterned to form a control gate 703 and a floating gate 704, as shown in FIG. 7. In an embodiment, the control gate and the floating gate are doped to increase their conductivity.

Figure 8:
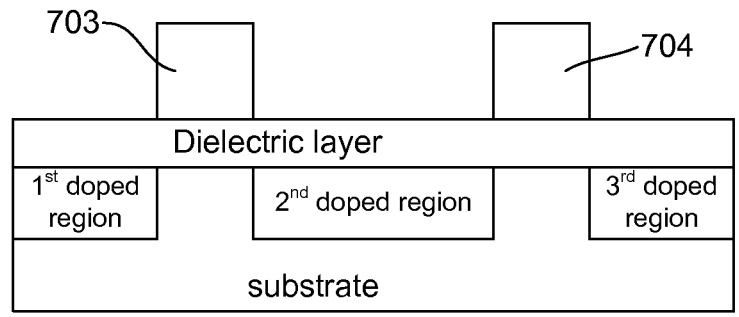
Figure 9:
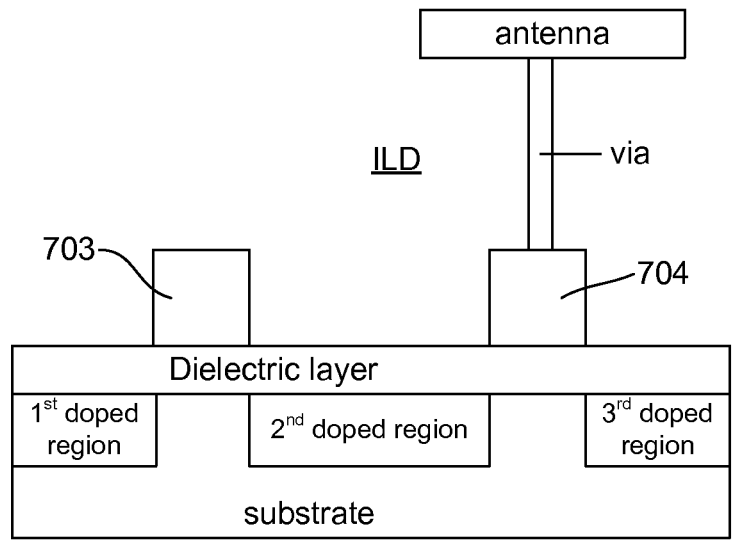

FIG. 8 is a cross-sectional diagram illustrating the forming of the first, second and third doped regions using the control gate and the floating gate as protective masks. Interlayer dielectric layer, via and a conductive plate are then subsequently formed according to known techniques for forming an antenna test structure. FIG. 9 is a simplified cross-sectional diagram of a device for monitoring charging effects according to an embodiment of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a device for monitoring charging effects, the method comprising:
   providing a semiconductor substrate having a surface region;
   forming a gate dielectric layer overlying a first portion and a second portion of the surface region of the semiconductor substrate;
   performing an implant to adjust a threshold voltage in the second portion of the surface of the semiconductor substrate;

forming a polysilicon material overlying the first and second portions;

patterning the polysilicon material to form a first gate and a second gate, the first gate being over the first portion and the second gate being over the second portion;

forming first, second, and third doped regions in the semiconductor substrate using the first and second gates as a protective mask;

wherein the second doped region has the first gate on one side and the second gate on the other side;

forming an interlayer dielectric layer over the second gate; and forming a conductive layer over the interlayer dielectric layer, the conductive layer being electrically coupled to the second gate and configured to collect charges;

wherein the second doped region is interposed between the first and the third doped regions, the second doped region is coupled to the first doped region through the first portion of the substrate, and the second doped region is coupled to the third doped region through the second portion of the substrate; and wherein the second doped region has a positive electric charge on a side to the first gate and a negative electric charge on an opposite side.

2. The method of claim 1 further comprising depositing a photoresist mask over the first portion of the surface prior to performing the implant in the second portion of the surface of the semiconductor substrate.

3. The method of claim 2, wherein the second gate comprises a floating gate.

4. The method of claim 1, wherein the first doped region comprises a source of the first gate and the third doped region comprises a drain of the first gate.

5. A method for determining electrical charges on a semiconductor device, the method comprising:

providing a substrate, the substrate comprising a first doped region, a second doped region, and a third doped region, a gate dielectric layer over the substrate, a gate and a floating gate over the gate dielectric layer, the gate and the floating gate being separated by the second doped region, the second doped region having a positive electric charge disposed on one side and a negative electric charge disposed on an opposite side;

providing a charge collecting component configured to collect electrical charges and being electrically coupled to the floating gate;

exposing the substrate to a plasma;

measuring an electrical property associated with a current between the first doped region and the third doped region, the current being associated with a voltage potential of the floating gate; and determining a level of electrical charge based at least in part on the electrical property.

6. The method of claim 5 further comprising determining a leakage current characteristic, the leakage current characteristic being associated with a charge accumulated on the floating gate.

7. The method of claim 5, wherein the floating gate is connected to the charge collection component through a via structure.

8. The method of claim 5, wherein the substrate is characterized by a p-type conductivity and the first, second and third doped regions are characterized by an n-type conductivity.

9. The method of claim 5, wherein the first doped region comprises a source of the gate and the third doped region comprises a drain of the floating gate.

10. The method of claim 5, wherein the step of measuring an electrical property associated with a current between the first doped region and the third doped region comprises:

applying bias voltages to the gate, the first doped region, the third doped region, and the substrate;

applying no bias voltage to the floating gate;

causing a voltage potential at the second doped region through coupling; and determining a leakage current and/or a threshold voltage of the semiconductor device.

11. A method for making a device for monitoring charging effects, the method comprising:

providing a semiconductor substrate having a surface region;

forming a gate dielectric layer overlying a first portion and a second portion of the surface region of the semiconductor substrate;

performing an implant to adjust a threshold voltage in the second portion of the surface of the semiconductor substrate;

forming a polysilicon material overlying the first and second gate dielectric layers;

patterning the polysilicon material to form a first gate and a second gate, the first gate being over the first portion and the second gate being over the second portion;

forming first, second, and third doped regions in the semiconductor substrate using the first and second gates as a protective mask, wherein the second doped region is interposed between the first and the third doped regions, and wherein the second doped region has the first gate on one side and the second gate on the other side;

wherein the second doped region has a positive electric charge on a side to the first gate and a negative electric charge on an opposite side;

forming an interlayer dielectric layer over the second gate;

forming a conductive layer over the interlayer dielectric layer, the conductive layer being electrically coupled to the second gate and configured to collect charges;

forming a connection between the first gate and a conductor for coupling the first gate to a bias voltage; and maintaining the second gate as a floating gate free from connections for coupling to any operating voltage.

12. The method of claim 11, wherein the first gate comprises a control gate.

* * * * *